United States Patent
Hoose et al.

(10) Patent No.: US 6,697,411 B2
(45) Date of Patent: Feb. 24, 2004

(54) MODULATABLE MULTI-WAVELENGTH SEMICONDUCTOR EXTERNAL CAVITY LASER

(75) Inventors: John Hoose, Fairport, NY (US); Robert Frankel, Rochester, NY (US)

(73) Assignee: Chromaplex, Inc., West Henrietta, NY (US)

(*) Notice: Subject to any disclaimer, the term of this patent is extended or adjusted under 35 U.S.C. 154(b) by 122 days.

(21) Appl. No.: 10/118,636

(22) Filed: Apr. 8, 2002

(65) Prior Publication Data

US 2002/0146054 A1 Oct. 10, 2002

Related U.S. Application Data

(60) Provisional application No. 60/282,510, filed on Apr. 9, 2001.

(51) Int. Cl.[7] .................................................. H01S 3/10
(52) U.S. Cl. ........................... 372/92; 372/20; 372/26; 372/102
(58) Field of Search ..................... 372/92, 20, 26, 372/23, 102

(56) References Cited

U.S. PATENT DOCUMENTS

| | | | |
|---|---|---|---|
| 4,786,131 A | 11/1988 | Mahapatra et al. | 350/96.16 |
| 5,228,050 A | 7/1993 | LaCourse et al. | 372/50 |
| 5,524,012 A | 6/1996 | Wang et al. | 372/23 |
| 5,987,050 A * | 11/1999 | Doerr et al. | 372/108 |
| 6,014,390 A * | 1/2000 | Joyner | 372/20 |
| 6,192,062 B1 | 2/2001 | Sanchez-Rubio et al. | 372/92 |
| 6,240,118 B1 * | 5/2001 | Doerr et al. | 372/64 |
| 6,256,328 B1 | 7/2001 | Delfyett et al. | 372/23 |
| 6,295,304 B1 | 9/2001 | Koch et al. | 372/6 |

OTHER PUBLICATIONS

Li, Y. P. & Henry, C. H. "Silicon Optical Bench Waveguide Technology" *Optical Fiber Communications IIIB*. I. P. Kaminov & T. L. Koch eds., Academic Press, 351–358 (1997), no month.

Niemi, T. et al. Tunable Silicon Etalon for Simultaneous Spectral Filtering and Wavelength Monitoring of a DWDM Transmitter. *IEEE Photonics Technology Letters* 13, 58–60 (Jan. 2001).

* cited by examiner

*Primary Examiner*—James Davie
(74) *Attorney, Agent, or Firm*—Ropes & Gray LLP

(57) ABSTRACT

A multi-wavelength external cavity laser system is disclosed, wherein an array of individual laser elements is placed in a shared laser cavity for all wavelengths that is defined by a free space grating, an optional reflector, and a single relay lens. Laser radiation from the cavity can be externally modulated at each wavelength and outputted as an overlapping beam having substantially all the wavelengths produced by the laser elements through a single fiber or as an array of wavelength-separated beams. A modular design facilitates the addition and/or repair of individual or several channels.

23 Claims, 4 Drawing Sheets

MODULATABLE MULTI-WAVELENGTH SEMICONDUCTOR EXTERNAL CAVITY LASER

CROSS-REFERENCE TO OTHER PATENT APPLICATIONS

This application claims the benefit of U.S. provisional Application No. 60/282,510, filed Apr. 9, 2001, the entire content of which is incorporated herein by reference.

FIELD OF THE INVENTION

The invention relates to multi-wavelength lasers, and more particularly, to a modulatable external cavity multi-emitter semiconductor laser with a predetermined wavelength spacing for DWDM applications.

BACKGROUND OF THE INVENTION

Optical networks are becoming increasingly complex and use multiple wavelengths transmitted simultaneously over the same fiber. This transmission method is referred to as dense wavelength division multiplexing (DWDM), with the number of active channels continuing to increase. The international telecommunications union (ITU) standards body has proposed a channel allocation grid with 100 GHz channel spacing (~0.81 nm at a 1550 nm wavelength) on even 100 GHz intervals, counting nominally in both directions from a center frequency of 193.1 THz. Newer systems are being designed to reduce the channel spacing to 50 GHz or less. In addition, the total wavelength range over which these devices are designed to operate is increasing. Cost control is very important for system deployment. It would be very desirable to have one laser source module serve as the source for all the channels in the optical system. In addition, it is desirable to have the module be both scalable and upgradeable in a granular manner. Scaleable means that the system may be upgraded from small channel counts to larger channel counts. Granularity implies that the upgrades can be implemented one channel, or a few channels, at a time.

Optical communication systems are required to have a service life in excess of twenty years. Lasers should be easily reconfigurable and/or replaceable if one of the laser channels malfunctions. In addition, as channel count increases from the present channel count of less than 40 to greater than 100, it is very cost effective not to stock 100 different spares, but preferably at most a few "generic" lasers that can be used for several wavelengths.

With a channel spacing of 25 GHz or less, wavelength stability of laser channel sources must be better than a few percent of the channel spacing. The component and system cost of new generations of networks that require greater stability and closer channel spacing should also not increase. Furthermore, crosstalk between channels should be less than 30 dB of the peak channel power which is typically in the range of 1–10 mW.

Devices that combine multiple wavelengths from different semiconductor laser sources have been reported. Integrated devices with an echelle grating or an arrayed waveguide grating as dispersive optical element have been built on a single semiconductor substrate. These devices require complex fabrication technologies and only allow limited, if any, wavelength tuning of the individual channels. In addition it is difficult to manufacture large channel count systems by these techniques, and replacement of individual channels is difficult.

Wavelength-tunable external cavity laser diodes have been employed in laser test equipment and provisioned as spares in optical networks. Multi-wavelength external cavity laser diode arrays with several emitters have also been reported, wherein the output is combined into overlapping beams that can be propagated wavelength-multiplexed, for example, through an optical fiber. However, such lasers, when electrically modulated, experience chirp which alters the output wavelength of the lasers, i.e. the carrier frequency, during the digital bit stream.

It would therefore be desirable to provide a laser source module that produces optical radiation for a plurality of channels in a specified band of an optical fiber transmission system, and more particularly a modulatable laser source module with improved wavelength stability.

SUMMARY OF THE INVENTION

The invention is directed to a multi-wavelength external-cavity laser system. An array of individual laser elements is placed in a shared laser cavity for all wavelengths defined by a free space grating and a single relay lens. Laser radiation from the cavity may be outputted as an array of wavelength-separated beams that can be individually modulated by external modulators or as an overlapping beam into a single fiber having substantially all the wavelengths. A modular design allows the addition and/or repair of individual channels or several channels.

According to one aspect of the invention, an external cavity laser source includes a free space external cavity and a plurality of optical modulators. The free space external cavity has a plurality of optical gain elements, wherein each of the optical gain elements generates optical radiation having a unique wavelength. The free space external cavity further includes a first optical element having a first focal plane, the first optical element positioned to substantially place the first focal plane at the plurality of optical gain elements and to intercept the generated optical radiation emitted from a first end face of optical gain elements; and a dispersive element positioned to intercept the radiation from the first optical element and diffracting the intercepted radiation. The diffracted radiation is returned through the first optical element to the first end face of the optical gain element that is associated with the unique wavelength.

This arrangement represents a shared cavity with separate optical gain regions.

Each of the plurality of optical modulators is associated with a respective one of the optical gain elements and adapted to intercept radiation from a second end face opposite the first end face of the respective optical gain element. Each of the optical modulators can therefore transmit a beam with a controllably modulated intensity at the unique wavelength.

The dispersive element can also operate in dual-pass which improves the overall wavelength resolution of the system. In this arrangement, the laser source includes a reflecting element, wherein the dispersive element is positioned between the first optical element and the reflecting element; and wherein the reflecting element is positioned to intercept radiation from the dispersive element and to retroreflect the intercepted radiation to the dispersive element.

In addition, the invention provides the ability to completely re-multiplex all channels into a single output fiber with or without requiring multi-fiber interconnection. This provides a very significant simplification in system design and a reduction in cost with significant functional improvements over standard distributed feedback lasers. According to this embodiment, a beam combiner intercepts the controllably modulated beams having the plurality of wavelengths and combines the controllably modulated beams into an overlapping beam. The beam combiner can include a second optical element having a second focal plane, with the second optical element positioned to substantially place the second focal plane at the plurality of the optical modulators and to intercept the controllably modulated beams from the optical modulators. A second dispersive element can intercept radiation from the second optical element and return the overlapping beam through the second optical element.

The dispersive elements can be free space gratings or immersion gratings, with the immersion gratings advantageously fabricated of silicon.

Further embodiments can include one or more of the following features. An optical receiving element, such as an optical fiber or waveguide or free space optics, can be placed in the second focal plane to receive the overlapping beam. Alternatively, the beam combiner can be an Nx1 optical coupler, such as a fiber coupler, a star coupler, or an arrayed-waveguide grating (AWG) coupler.

The external cavity can also include a spectral filter, for example, a Fabry-Perot etalon, which can be placed between the dispersive element and the reflective element. To stabilize the wavelengths, the laser source can further include a wavelength locker which derives an input signal from a unique wavelength of the plurality of wavelengths and controls the dispersive element and/or the spatial filter so as to collectively lock each wavelength of the plurality of wavelengths based on the input signal from the unique wavelength.

The extended length of the cavity allows very narrow laser line structure, with very high power in each channel. Furthermore, the invention enables all channels to be locked together to an external wavelength meter or molecular or atomic absorption cell referenced laser in order to economically prevent wavelength drift of all channels. Locking all channels together enables the potential to use coherent heterodyne detection schemes that can increase the system sensitivity by up to 20 dB. This should also provide even less expensive communications systems with the requirement of less signal restoration by Erbium Doped Fiber Amplifiers (EDFA) in long haul applications. It is also possible to substitute other gain media into the cavity such as optically pumped crystals and glasses.

Embodiments of the invention may incorporate one or more of the following features. Individual mirrors can be placed at the focus of the grating imaging optics operating as parallel output couplers, with the reflectivity of mirrors being tailored to the semiconductor lasers' gain coefficients. The grating can be angle-tuned to different parts of the ITU grid.

The modulator array may be a lithium niobate modulator array, a planar waveguide electro-absorptive array, silicon Fabry-Perot etalon array or some other form of modulator known in the art.

Further features and advantages of the present invention will be apparent from the following description of preferred embodiments.

BRIEF DESCRIPTION OF THE DRAWINGS

The following figures depict certain illustrative embodiments of the invention. These depicted embodiments are to be understood as illustrative of the invention and not as limiting in any way.

DETAILED DESCRIPTION OF ILLUSTRATED EMBODIMENTS

The invention is directed to a multi-emitter multi-wavelength semiconductor laser device, and more particularly to an external cavity laser with external modulators that modulate the intensity of the optical radiation emitted by the individual laser emitters.

Figure 1:
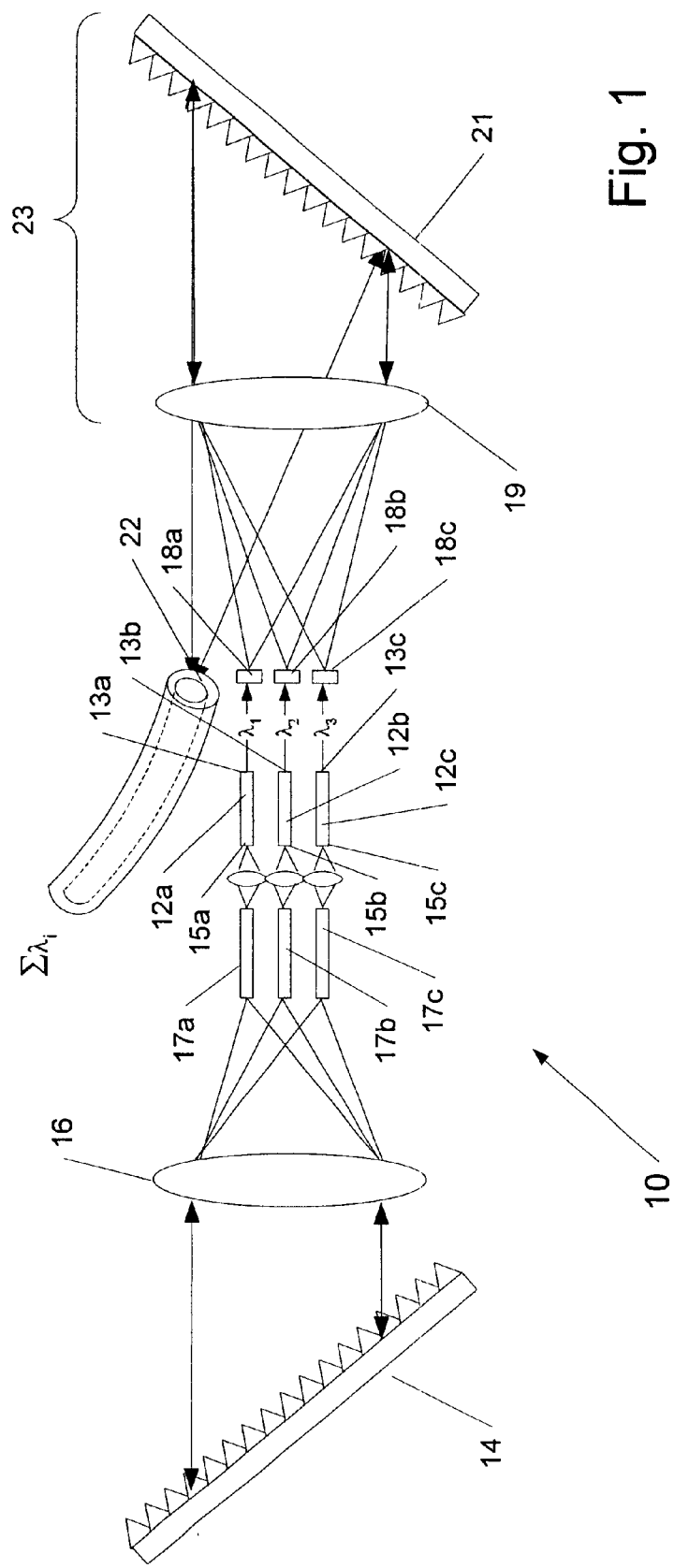
FIG. 1 depicts an external cavity multi-wavelength laser system in single-pass configuration.

Referring first to FIG. 1, a modulatable multi-emitter multi-wavelength laser device 10 includes a plurality of laser emitters 12a, 12b, 12c, with each emitter generating optical radiation at specific wavelengths $\lambda_1$, $\lambda_2$, $\lambda_3$ that can be different from one another. The external laser cavity is formed by respective semi-transparent laser end facets 13a, 13b, 13c and a common grating 14 that diffracts the laser radiation with wavelengths $\lambda_1$, $\lambda_2$, $\lambda_3$ emerging from the end facets 15a, 15b, 15c and retroreflects the diffracted laser radiation back into the laser 12a, 12b, 12c which generated the radiation at the specific wavelength $\lambda_1$, $\lambda_2$, $\lambda_3$. The external cavity geometry with grating 14 depicted in FIG. 1 is generally referred to as Littrow configuration, in which the grating 14 diffracts the impinging radiation just once.

The diode-facets 15a, 15b, 15c are preferably anti-reflection (AR) coated with a residual reflectivity of $10^{-4}$–$10^{-5}$. The laser cavity may also include focusing optics, such as a full-field focusing and collimating lens 16 and relay lenses 17a, 17b, 17c associated with the various lasers 12a, 12b, 12c. The exemplary relay lenses 17a, 17b, 17c depicted in FIG. 1 can consist of optical guide/lens combinations, but can also be implemented with GRIN lenses and other suitable relay optical elements known in the art, such as a flared waveguide array that matched the spacing between the laser elements 12a, 12b, 12cInstead of using relay lenses, the facets 15a, 15b, 15c of the laser elements 12a, 12b, 12c can also be positioned directly in the focal plane of the multiplexer relay lens 16. Fiber coupling provides a convenient disconnect mechanism for upgrading the system and replacing laser diodes if one or more of the diodes malfunctions.

Advantageously, an external modulator or modulator array can be used in high data rate systems (those with data rates exceeding 1 GHz) to modulate the intensity of each wavelength. The modulator array may be an array of lithium niobate modulators, a planar waveguide electro-absorptive array, silicon Fabry-Perot etalon or another type of modulator known in the art.

In the embodiment illustrated in FIG. 1, the output beams emerging from laser output facets 13a, 13b, 13c are intercepted by corresponding optical modulators 18a, 18b, 18c, which individually and independently modulate the intensity of each output beam. The semi-transparent output facets 13a, 13b, 13c may have a reflectivity of 10–50%. The reflectivity of each of output facets 13a, 13b, 13c can be tailored so as to provide uniform gain across the wavelength range $\lambda_1$, $\lambda_2$, $\lambda_3$ by enhancing the reflectivity at those wavelengths where the semiconductor laser gain coefficients are low. Using mirrors with a tailored reflectivity can flatten the cavity gain to a higher degree than can be achieved with traditional spectral-flattening Bragg grating filters.

In order to achieve lasing at multiple wavelengths, the laser equation $$T(\lambda)=G(\lambda)-L(\lambda)>0$$

must be satisfied at each of the wavelengths $\lambda_1$, $\lambda_2$ and $\lambda_3$. $T(\lambda)$ is herein the threshold cavity gain, $G(\lambda)$ the gain of the lasing medium and $L(\lambda)$ the round trip loss of the cavity. If the gain/loss is not uniform across the lasing wavelengths $\lambda_1$, $\lambda_2$, $\lambda_3$, then the gain/loss terms should be balanced for each lasing wavelength. The gain of semiconductor lasers may be adjusted by changing the laser drive current. The exemplary cavity is designed to operate in single mode on all channels. This can be accomplished by matching the cavity mode spacing to the mode selectivity of the grating 14 and/or the etalon 24 in the doublepass geometry illustrated in FIGS. 2 and 4.

FIG. 1 shows the gain media implemented as an array of laser diodes 12a, 12b, 12c, which for the particular wavelength region preferred for optical fiber communication can be, for example, InGaAsP laser diodes emitting in a wavelength range between 1520 and 1600 nm. The semiconductor lasers may be optically pumped or electrically pumped. In general, depending on the application, laser diodes emitting in other wavelength ranges may be used. Alternatively, the gain medium can also be an erbium-doped (or another rare earth doped) waveguide that provides optical gain. In addition, apertures and spatial filters may be employed in the optical path to minimize gain and feedback at wavelengths other than the lasing channels.

The modulated output from the external modulators 18a, 18b, 18c can be combined by a beam combiner 23 into an overlapping beam that includes the wavelengths $\lambda_1$, $\lambda_2$, $\lambda_3$. An exemplary beam combiner 23 which includes a focusing element 19 and a grating 21 is shown in FIG. 1. The output faces of modulators 18a, 18b, 18c are located in the focal plane of the focusing element 19, such as a lens 19. Grating 21 intercepts the preferably collimated radiation from lens 19 and forms the overlapping beam at, for example, an input facet of a fiber waveguide 22. The overlapping beam with the combined wavelengths $\Sigma\lambda_i$ is then propagated through the fiber waveguide. Other optical elements, such as free space optics and planar optical waveguides, can also be used.

Figure 3:
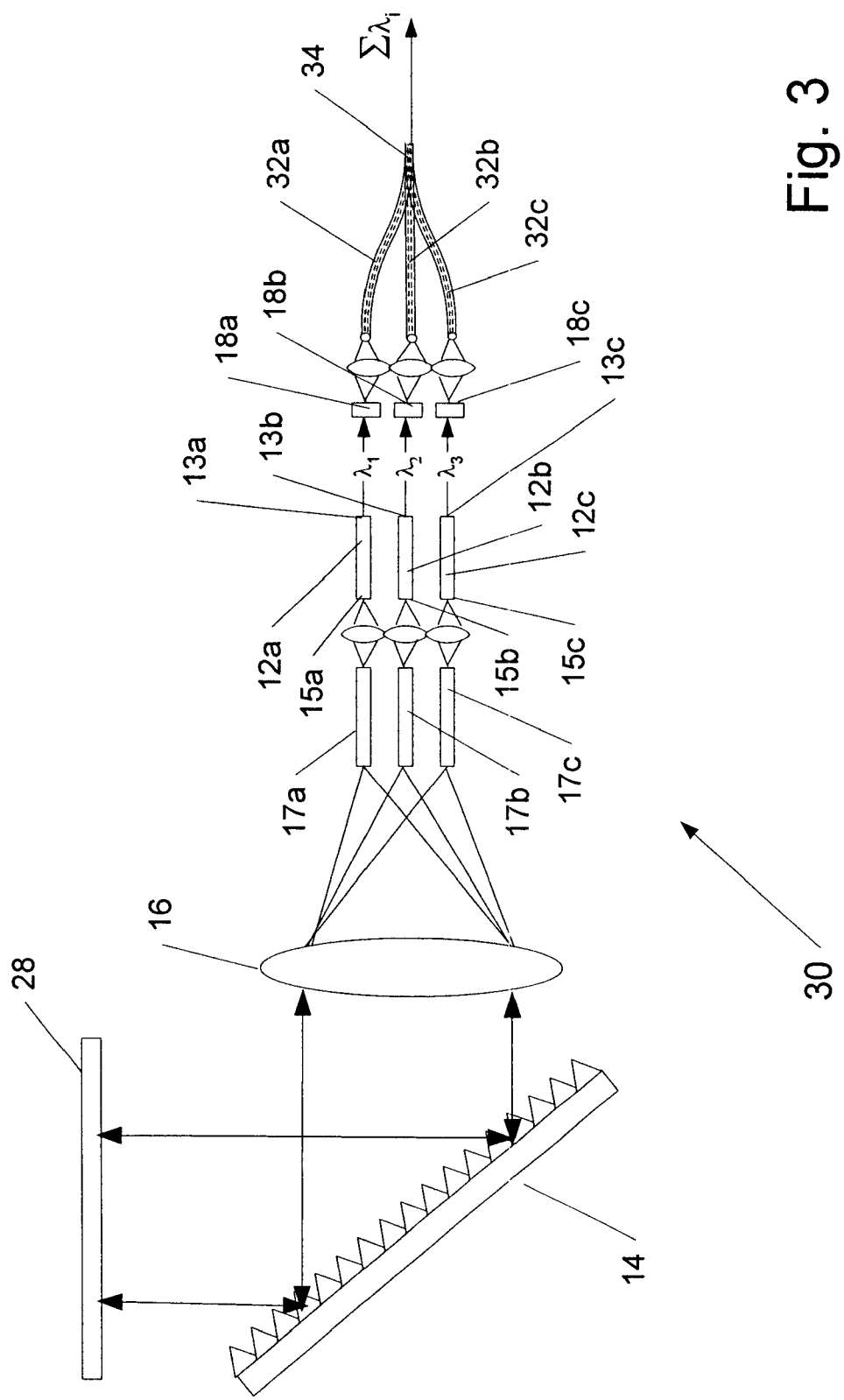
FIG. 3 depicts the external cavity multi-wavelength laser system of FIG. 2 with a fiber beam combiner.

An alternative beam combiner 34 is depicted in FIG. 3 wherein the output beams emerging from laser facets 13a, 13b, 13c are imaged onto corresponding input facets of optical waveguides, such as optical fibers 32a, 32b, 32c, or a star coupler (not shown) or an arrayed-waveguide grating (AWG) (not shown). Star couplers and AWG's are known in the art. It will be understood that the optical fibers 32a, 32b, 32c, and the star coupler combine the intensities of the various laser beams, whereas the grating coupler 23 and the AWG provide additional wavelength selectivity.

Figure 2:
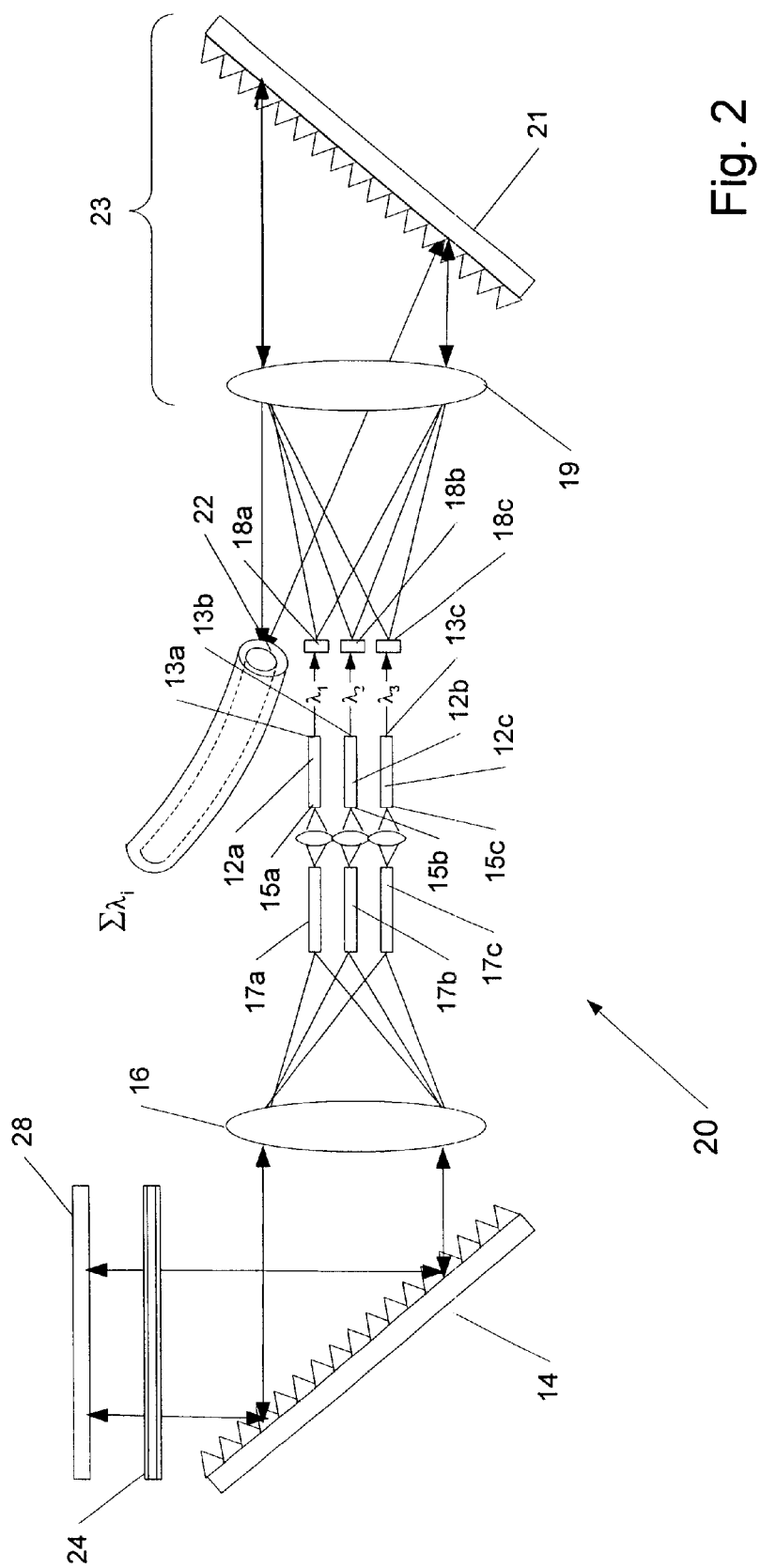
FIG. 2 depicts an external cavity multi-wavelength laser system in double-pass configuration.

Referring now to FIG. 2, a double-pass grating configuration 20, sometimes referred to as Litmann-Metcalf configuration, can provide enhanced mode separation. Unlike the embodiment 10 of FIG. 1, the grating configuration 20 includes an additional reflective surface of, for example, mirror 28, whereby radiation emitted by the laser elements 12a, 12b, 12c and collimated by lens 16 is diffracted a first time by grating 14, then retro-reflected by mirror surface 28 back onto the grating 14 to be diffracted a second time and reimaged by lens 16 onto the corresponding laser elements 12a, 12b, 12c.

The linewidth of the lasing wavelength can be narrowed by inserting an etalon, such as a Fabry-Perot etalon 24, in the cavity, as indicated in FIG. 2. It will be understood that this type of etalon can also be used with the external cavity configuration depicted in FIG. 3.

Figure 4:
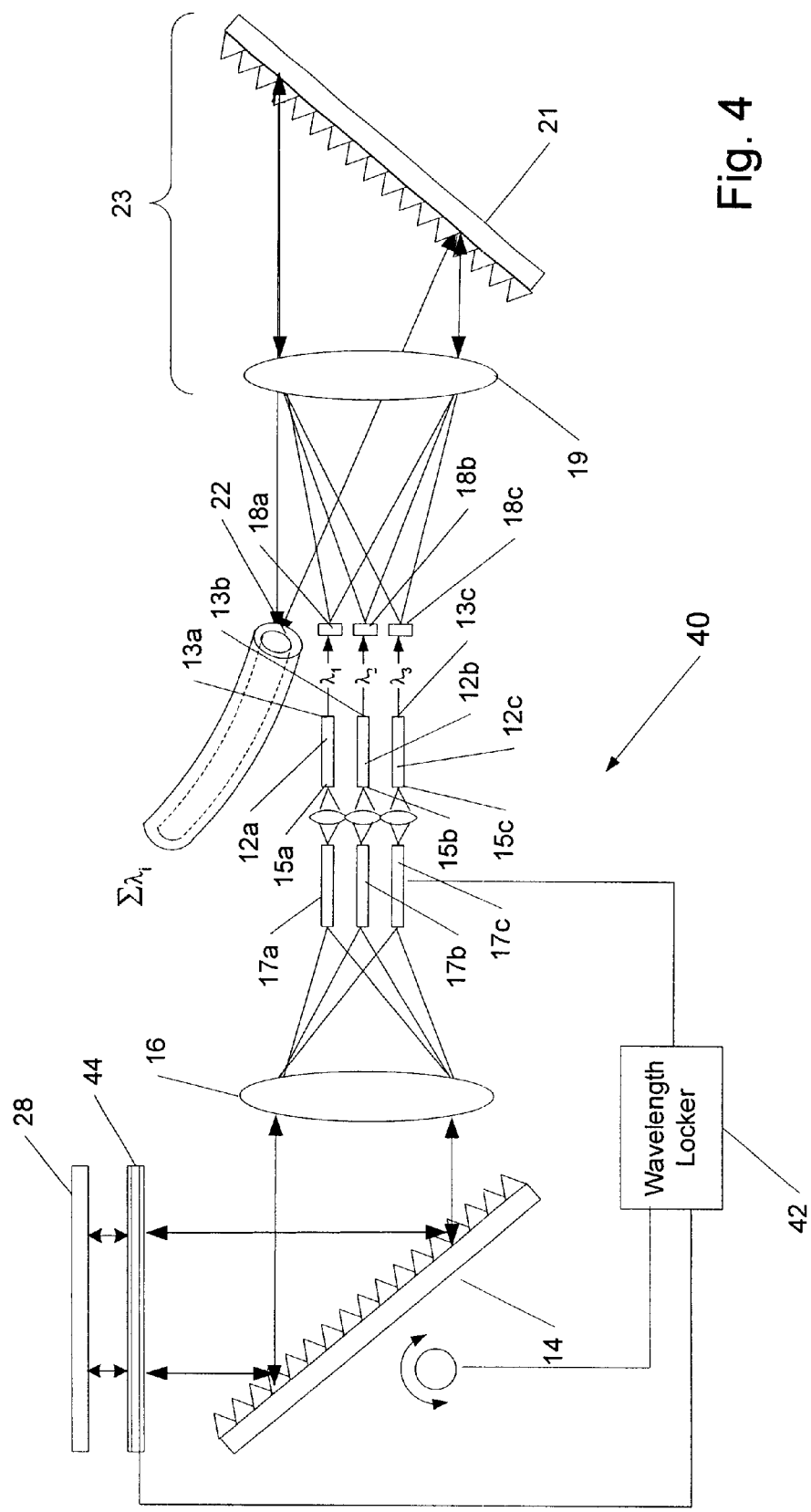
FIG. 4 depicts the external cavity multi-wavelength laser system of FIG. 2 with a wavelength locker.

Referring now to FIG. 4, a wavelength locker 42 can be provided that monitors the wavelength of one channel, for example, the emission wavelength $\lambda_3$ of laser element 12c. Information from the single wavelength $\lambda_3$ herein controls the entire set of wavelengths $\lambda_1$, $\lambda_2$, $\lambda_3$ through feedback control of the grating 14 and/or the etalon 44. The function the various components of the system, as they relate to wavelength control, will now be explained.

Two components are used to define the channel wavelength—the wavelength dispersive free space grating 14 and the intra-cavity etalon 24, 44. An intra-cavity etalon 24, 44 that is useful for fiber optic communication can be designed to have a free spectral range equivalent to the ITU grid spacing for which the system is designed, for example, 200, 100, 50, 25 or 12.5 GHz. The etalon 24, 44 may have finesse of at least 10–100, and can be tuned by adjusting its temperature or thickness.

Although the multiplexer/demultiplexer is shown as incorporating a free space grating 14, other types of dispersive elements, such as array waveguides and/or two-dimensional photonic crystals may be used as the multiplexer/demultiplexer section of the laser.

The diffraction efficiency of gratings tends to be polarization-dependent, making the grating also useful as a polarizer by reflecting primarily a single polarization. An additional polarizer may be placed in the multiplexer section between the lens and the grating to enhance the polarization selectivity of the light in the cavity. In addition, the relay optics 17a, 17b, 17c may be made of a polarization-selective or polarization-maintaining fiber.

As mentioned above, the wavelength locker locks to a single wavelength reference source and tunes all wavelengths $\lambda_1$, $\lambda_2$, $\lambda_3$ at once. In one embodiment of a wavelength locker, a beat frequency between one of the laser lines and a reference laser which is locked, for example, to an absorption cell, can be monitored. An exemplary wavelength locker 42 is shown in FIG. 4. Since the reference laser can be locked to better than 1 part in $10^7$–$10^8$ and the beat frequency may be known to kHz, the system can in principle be stabilized to better than 0.01 GHz. This level of stabilization is exceptional for a communication laser. Wavelength stability of 1 picometer or 0.125 GHz should be adequate for channel spacing of less than 12.5 GHz. Other wavelength locking technologies, for example an athermalized etalon tuned to the ITU grid, may also be used. The output wavelengths $\lambda_1$, $\lambda_2$, $\lambda_3$ of the system 40 can be adjusted, for example, by rotating the grating and translating the output fiber array, and/or by changing the etalon spacing, as depicted in FIG. 4.

In summary, the multi-wavelength laser system described herein include individually modulatable laser output beams with accurate wavelength control. The reflectivity of the laser facet output mirrors can be tuned to flatten the optical gain across the laser lines. A modular design facilitates upgrade and repair, requiring only a single type of laser diode. Precise active wavelength tuning can be achieved by using spectral filters, such as an etalon, a ring reflector, and sampled Bragg gratings with a suitable reference wavelength feedback.

While the invention has been disclosed in connection with the preferred embodiments shown and described in detail, various modifications and improvements thereon will become readily apparent to those skilled in the art. Although only 3 exemplary wavelengths are shown, the semiconductor laser can emit any number of wavelengths suitable for the application. The dispersive elements can also be immersion gratings of a type described, for example, in commonly assigned U.S. patent application Ser. No. 09/950,124, having filing date of Sep. 10, 2001, now U.S. Pat. No. 6,496,622, the entire content of which is incorporated herein by reference. Immersion gratings are made of a transparent material with an index of refraction n>1 in the infrared wavelength range of interest, for example silicon (n~3.5), which advantageously decreases the overall physical size of the system. Accordingly, the spirit and scope of the present invention is to be limited only by the following claims.

What is claimed is:

1. An external cavity laser source comprising:
   a) a free space external cavity comprising:
      a plurality of optical gain elements, each of the optical gain elements generating optical radiation having a unique wavelength;
      a first optical element having a first focal plane, the first optical element positioned to substantially place the first focal plane at the plurality of optical gain elements and to intercept the generated optical radiation emitted from a first end face of optical gain elements; and
      a dispersive element positioned to intercept the radiation from the first optical element and diffracting said intercepted radiation, said diffracted radiation being returned through the first optical element to the first end face of the optical gain element associated with the unique wavelength;
      and
   b) a plurality of optical modulators, each modulator associated with a respective one of the optical gain elements and adapted to intercept radiation from a second end face opposite the first end face of the respective optical gain element,
      wherein each of the optical modulators transmits a beam with a controllably modulated intensity and having the unique wavelength.

2. The laser source of claim 1, wherein the optical gain element comprises a semiconductor laser.

3. The laser source of claim 1, wherein the plurality of optical gain elements comprises a semiconductor laser array.

4. The laser source of claim 1, further comprising a reflecting element, wherein the dispersive element is positioned between the first optical element and the reflecting element; and wherein the reflecting element is positioned to intercept radiation from the dispersive element and to retroreflect the intercepted radiation to the dispersive element.

5. The laser source of claim 1, further including a beam combiner that intercepts the controllably modulated beams having the plurality of wavelengths and combines the controllably modulated beams into an overlapping beam having the plurality of wavelengths.

6. The laser source of claim 5, wherein the beam combiner comprises:
   a second optical element having a second focal plane, the second optical element positioned to substantially place the second focal plane at the plurality of the optical modulators and to intercept the controllably modulated beams from the optical modulators; and
   a second dispersive element adapted to intercept radiation from the second optical element and to return through the second optical element the overlapping beam.

7. The laser source of claim 6, further comprising an optical receiving element that receives in the second focal plane the overlapping beam.

8. The laser source of claim 7, wherein the optical receiving element comprises an optical fiber.

9. The laser source of claim 5, wherein the beam combiner comprises an Nx1 optical coupler.

10. The laser source of claim 9, wherein the optical coupler is a fiber coupler.

11. The laser source of claim 9, wherein the optical coupler is an arrayed-waveguide grating (AWG) coupler.

12. The laser source of claim 9, wherein the optical coupler is a star coupler.

13. The laser source of claim 4, further comprising a spectral filter disposed in the external cavity.

14. The laser source of claim 13, wherein the spectral filter is a Fabry-Perot etalon.

15. The laser source of claim 13, wherein the spectral filter is disposed between the dispersive element and the reflective element, the laser source further comprising a wavelength locker which derives an input signal from a unique wavelength of the plurality of wavelengths and controls the dispersive element so as to collectively lock each wavelength of the plurality of wavelengths based on the input signal from the unique wavelength.

16. The laser source of claim 1, wherein the dispersive element is a free space grating.

17. The laser source of claim 1, wherein the dispersive element is an immersion grating.

18. The laser source of claim 17, wherein the immersion grating comprises silicon.

19. The laser source of claim 7, wherein the second dispersive element is a free space grating.

20. The laser source of claim 7, wherein the second dispersive element is an immersion grating.

21. The laser source of claim 20, wherein the immersion grating comprises silicon.

22. Method for producing externally modulated multi-wavelength laser radiation, comprising:
   generating with a plurality of optical gain elements a plurality of free space optical beams, each beam having a unique wavelength;
   diffracting the plurality of free space optical beams emitted from a first facet of the gain elements;
   returning the diffracted beams to the first facet of the optical gain elements so that each gain element emitting the unique wavelength receives the diffracted beam having the unique wavelength; and
   modulating the plurality of free space optical beams emitted from a second facet of the gain elements to produce the externally modulated multi-wavelength laser radiation.

23. The method of claim 22, wherein the optical gain elements are semiconductor diode lasers.

* * * * *